Oct. 3, 1961 R. J. ROCKWELL 3,003,116

AUTOMATIC GAIN CONTROL AMPLIFIER

Filed March 9, 1960 6 Sheets-Sheet 1

INVENTOR.
RONALD J. ROCKWELL
BY Darby & Darby
ATTORNEYS

Oct. 3, 1961 R. J. ROCKWELL 3,003,116

AUTOMATIC GAIN CONTROL AMPLIFIER

Filed March 9, 1960 6 Sheets-Sheet 2

INVENTOR.

RONALD J. ROCKWELL

BY Darby & Darby

ATTORNEYS

INVENTOR.
RONALD J. ROCKWELL
BY Darby & Darby
ATTORNEYS

Oct. 3, 1961 R. J. ROCKWELL 3,003,116

AUTOMATIC GAIN CONTROL AMPLIFIER

Filed March 9, 1960 6 Sheets-Sheet 4

FREQUENCY RESPONSE AT VARIOUS INPUT LEVELS

INVENTOR.
RONALD J. ROCKWELL
BY *Darby & Darby*
ATTORNEYS

DISTORTION AT VARIOUS INPUT LEVELS

INVENTOR.
RONALD J. ROCKWELL
BY
Darby & Darby
ATTORNEYS

CHART RECORDING OF RECTIFIED OUTPUT

INVENTOR.
RONALD J. ROCKWELL
BY
Darby & Darby
ATTORNEYS

United States Patent Office 3,003,116
Patented Oct. 3, 1961

3,003,116
AUTOMATIC GAIN CONTROL AMPLIFIER
Ronald J. Rockwell, Cincinnati, Ohio, assignor to Crosley Broadcasting Corporation, Cincinnati, Ohio, a corporation of Ohio
Filed Mar. 9, 1960, Ser. No. 13,841
4 Claims. (Cl. 330—141)

This invention relates to amplifiers, and more particularly to an amplifier system whose gain is automatically controlled in a predetermined manner by a variable attenuator in response to variable amplitude input signals.

In a conventional audio amplifier circuit which supplies the audio modulation signal to the modulator of a radio broadcast transmitter, it is necessary to prevent the transmitter from overloading on large amplitude input signals. When this overloading occurs, distortion and other deleterious effects result. In broadcast transmitter systems it is also desirable to increase the percentage modulation which a low amplitude audio input signal produces on the carrier wave since this process improves the signal-to-noise ratio of the received signal at the fringe of the normal reception area. These effects have long been recognized and are discussed in the prior art.

Radio broadcasting has for its prime objective the faithful reproduction in the listener's home of those sensations of sound to which they would be subjected at the scene of the broadcast. A completely faithful reproduction of sounds in the home is never realized in practice, and in many cases it is actually undesirable. Probably one of the greatest defects in sounds broadcast and reproduced by current systems is the lack of auditory perspective.

A practical approach to the auditory perspective problem should take into account the degree of fidelity which will provide a reasonably satisfactory reproduction of various kinds of program material in an average home. For example, it is undesirable to attempt to accurately reproduce a symphony orchestra with its full 70 db volume range in the listener's home. The minimum noise level in an average residence is about 25 db above $10^{-16}$ watts per square cm. (the noise of an average whisper at a distance of 4 feet is 20 db). Therefore, the peak audio power of a symphony orchestra reproduced with its full volume range of 70 db in the average listener's home would be 95 db above $10^{-16}$ watts per square cm. This sound intensity is equivalent to the noise reproduced by a riveter at a distance of only 40 feet and is therefore very objectionable.

In order to overcome some of the aforesaid problems, the transmitted volume range of a program is usually made less than the volume range of the original program. This is accomplished by varying the gain of the transmitter audio amplifier in such a way that the large volume parts of the program are attenuated before transmission and the small volume parts are amplified, i.e., compressing the volume range. In many instances, this is done manually by an operator, at the transmitter. There are several reasons why this is done. First, the listener does not wish to reproduce a wide volume range such as encountered in a symphony orchestra, since the large volume parts of the program would be entirely too loud when the small volume portions are made just audible above room noise. Second, the permissible volume range is limited to approximately 50 db by the broadcast and receiving equipment, even in the most favorable cases. The compression of the volume range of the original program also prevents transmitter overloading and gives an increase in the signal-to-noise ratio at the fringe reception areas.

In order to provide the volume compression to overcome the aforesaid problems, several approaches have been tried. One of these involves the use of a transmitter audio amplifier circuit whose gain is automatically controlled in response to the amplitude of the input signal. In a typical circuit of this type, the control bias on one or more of a number of non-linear amplifier stages is varied in order to control the gain of the particular amplifier stage or stages. Such circuits of the A.G.C. type have inherent limitations. First of all, the amplitudes of the signals which they can handle and linearly amplify is restricted. Further, such systems are inefficient in that they waste a large amount of signal energy.

Other types of amplifier are also provided which are designed to overcome these problems. Some of these amplifiers incorporate circuits which delay the signal until gain correction is effected. Others convert the signal to a modulated and a de-modulated carrier so as to suppress "thump," etc.

Another circuit for automatically governing the dynamic level range in an audio frequency amplifier circuit is shown in my Patent No. 2,768,249, issued on October 23, 1956.

The circuit of my prior patent makes use of two cascaded vacuum tube, variable attenuators which are in series with the amplifier channel. As the impedances of the attenuators are increased, the gain of the amplifier channel decreases. Provision is made to control one of the attenuators by a signal which slowly responds to the input signals and which reduces attenuation for input signals below a given level and increases attenuation for signals above the given level. The second attenuator circuit is under the control of a fast acting circuit which responds to peaks of the instantaneous input signal intensity. A delay line is incorporated between the output of the slow acting attenuator network and the input of the fast acting attenuator network, and the input of the fast acting attenuator is connected ahead of the delay line. Therefore, the fast acting attenuator is automatically adjusted before the audio input signal reaches the attenuator input.

All of the aforementioned circuits have several inherent deficiencies. Among these, except in the latter described circuit of my prior patent, are the objectionable increase in background noise during the quiescent part of the program which is followed by an unwanted fast gain reduction as the program is resumed. Other effects, including a high harmonic distortion content which degrades the signal output, are also present.

In the present invention a circuit is provided for automatically controlling and compressing a preselected dynamic level range of audio input signals. This circuit has a main amplifier channel, in which the audio signal is amplified. A variable attenuator network is provided in the main amplifier channel to control the overall gain of the amplifier circuit. A control channel is provided which samples the intensity of the signal at various points of the main amplifier channel and produces a plurality of control signals to control the attenuator. One of the control signals is derived from a slow acting circuit which samples the audio input signal before it reaches the attenuator. This first control signal serves to make the attenuator respond slowly to input signals which are below the average level of signals normally applied to the circuit, in a manner to increase the gain of the amplifier channel. A second control signal is applied to the attenuator from another slow act circuit which receives its input signal from the final output amplifier of the main amplifier channel. This circuit provides increased attenuation for input signals above the normal level. The second signal takes precedence over the first control signal. In order to compensate for sudden, peak amplitude signals, a third control signal is supplied to the attenuator from a rapidly acting circuit whose input is also from the final output of the main amplifier channel. This rapid acting circuit responds to signals at a certain level above the normal operating level and the signal produced by the rapid acting circuit takes precedence over the other two control signals.

The main amplifier channel is therefore protected by an attenuator which is controlled by three control signals, which are produced in response to input signals of various amplitudes at different points of the main amplifier channel. By doing this, the amplifiers in the main channel are made to operate linearly around a fixed optimum point on their characteristic curve rather than operate on a shifting operating point as would result with an automatic gain control system which varies the bias on the respective amplifiers. By utilizing the system of the present invention, a wide range of volume compression has been obtained.

Also, in accordance with the present invention, the respective amplifiers in the main channel and in the control circuit are compensated to provide a relatively distortion free circuit with wide bandwidth capabilities. These two features are desirable in order to obtain high fidelity transmission of the signal. The amplifier is designed to have a frequency response within ±1 db over the range from 10 cycles per second to 30,000 cycles per second with a distortion content less than 0.5% under any increase or decrease of the input signals 10 decibels from normal.

It is therefore an object of this invention to provide an amplifier circuit whose gain is automatically controlled in response to input signals of varying amplitudes.

It is a further object of this invention to provide an amplifier circuit which handles input signals varying over a wide range of amplitudes, and compresses these signals into a predetermined volume range.

A further object of this invention is to provide an amplifier circuit whose gain is controlled by a variable attenuator which responds to a plurality of signals sampled from different points of the amplifier circuit.

Still a further object of the invention is to provide an amplifier circuit whose gain is automatically controlled by a variable attenuator, the atttenuator being operative in response to slowly and rapidly changing signals representative of the amplitude of the signal at various points of the main amplifier channel.

Other objects and advantages of the present invention will become more apparent upon consideration of the following disclosure and appended claims in conjunction with the accompanying drawings, in which:

Figure 1:
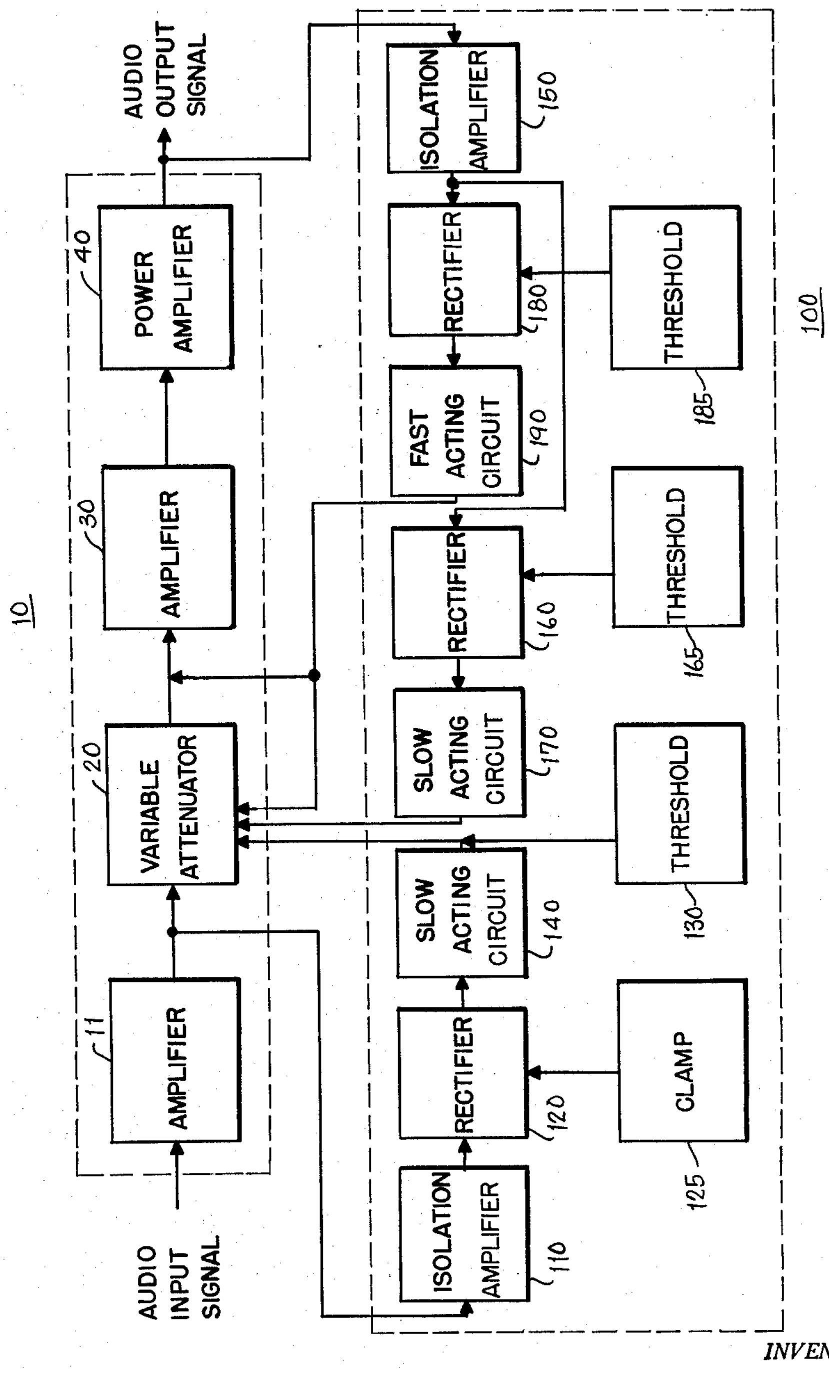
FIGURE 1 is a schematic block diagram of the automatic amplifier system.

Referring to FIG. 1, the main amplifier channel is shown within the dotted line rectangle 10 and the automatic control circuit within the dotted line rectangle 100. The audio input signal, which is to be amplified by the main channel amplifier 10, is first applied to the input of an amplifier 11. The audio input signal is derived from any suitable source, such as a microphone, magnetic tape, phonograph record, etc. The output of the amplifier 11 is supplied to the input of a variable attenuator 20 whose output is connected to the input of an amplifier 30. The amplifier 30 amplifies the signals at the output of the attenuator 20, and applies them to the input of the final power amplifier 40 of the main channel. The output of the power amplifier is used to supply a transmitter, tape or disk recorder, loud speaker, telephone line, or other type of equipment which is not a part of the present invention.

The audio signal applied to the input of the main channel amplifier 10 varies in amplitude over a wide range. It therefore must be compressed into a predetermined range so that the transmitter will not be overloaded. Volume compression is effected by the variable attenuator 20, which operates in response to signals produced by the control circuit 100. The operation of the control circuit is described below.

The signal at the output of the amplifier 11 is applied to the input of an isolation amplifier 110 whose output is connected to the input of a rectifier circuit 120. The rectifier 120 is clamped by the circuit 125 so that only signals of a level below the normal audio signal level applied to the main amplifier circuit 10 pass therethrough. The output of the rectifier 120 is applied to the input of a slow acting circuit 140 whose output is connected to the attenuator circuit 20.

At this point, it should be noted that the attenuator 20 is any suitable type whose effective attenuation in the circuit is variable in response to the control signals applied to it. One such attenuator is described in detail in my aforesaid Patent 2,768,249. That attenuator has the characteristic of increasing its attenuation when a positive D.C. signal is applied thereto, and decreasing its attenuation when a negative D.C. signal is applied. It should be realized that when the attenuation of the circuit 20 increases the overall gain of the main channel amplifier 10 decreases, and when the attenuation of the circuit 20 decreases, the overall gain of the amplifier 10 increases.

The attenuator 20 is biased by a threshold supply 130 to place a fixed amount of attenuation into the main channel amplifier 10 for a no signal input condition. For signals below the normal operating level, the output signal from the rectifier 120, which supplies the slow acting circuit 140, is of a polarity which decreases the attenuation of the circuit 20, thereby increasing the main channel amplifier gain. Due to the slow acting chracteristics of the long time constant circuit 140, the overall gain of the main channel amplifier is slowly increased in response to input signals below the normal operating level.

To produce the second and third control signal, the output of the power amplifier 40 is applied to the input of an isolating amplifier 150. The output of the amplifier 150 is applied to the input of respective rectifier circuits 160 and 180. Each of the rectifier circuits 160 and 180 is under the control of respective threshold circuits 165 and 185 which determine the conduction points of the respective rectifiers.

The output of the rectifier 160 is applied to the input of a slow acting circuit 170. The rectifier 160 is biased by the threshold 165 to be effective only in response to input audio signals at or above the normal operating level. The output of the slow acting circuit 170 is applied to the input of the variable attenuator 20 and is of a polarity which increases the attenuation of the circuit 20, thereby decreasing the main channel amplifier gain. The signal from the slow acting circuit 170 is given priority over the signal from the slow acting circuit 140 so that when the rectifier 160 is enabled, the gain of the main channel amplifier 10 can only be decreased and not increased. The rectifier 160 and slow acting circuit 170 keep the main channel amplifier 10 operating within a fixed volume range for all signals requiring slow gain increase or decrease.

In order to take care of any instantaneous peaks of input signal which might occur, a fast acting circuit 190 is connected to the output of the rectifier 180. Rectifier 180 is biased from a threshold source 185 to conduct at a fixed level of signal above the level of signal at which the rectifier 160 conducts. The fast acting circuit 190 rapidly follows the output signal of the rectifier 180 and applies its D.C. output to the attenuator 20 and to the amplifier 30. The output of the circuit 190 is of a polarity to reduce the amplifier channel gain by increasing the attenuation supplied by the circuit 20. In this manner attenuation is provided for input signal peaks and the gain of the main amplifier channel 10 is rapidly reduced so that the transmitter is not overloaded.

In order to provide "thump" suppression, the output of the circuit 190 is also applied to the input of amplifier 30 to neutralize the effect of large amplitude, rapidly changing input signals which cause the attenuator 20 to react rapidly. This arrangement also eliminates the need for an inter-stage coupling transformer.

Figure 2:
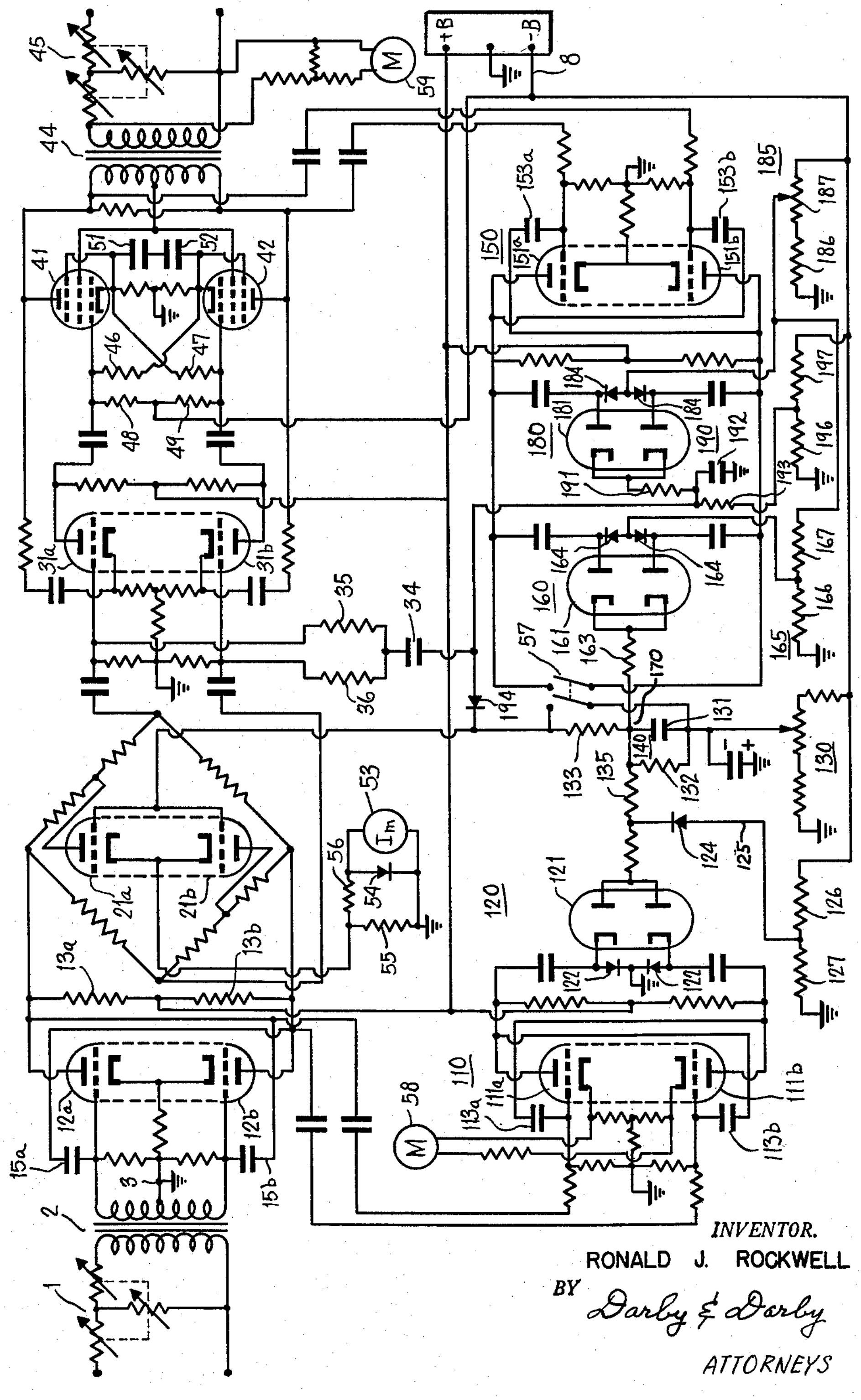
FIGURE 2 is a schematic diagram showing the circuit details of the block diagram of FIG. 1.

Referring to FIG. 2, a circuit for carrying out the invention is described. The input signal is applied across an unbalanced T-pad variable resistance attenuator 1 whose variable arms are mechanically ganged together so that the resistors of the pad may be simultaneously adjusted. The attenuator 1 is connected to the primary winding of an input transformer 2 whose output winding is center-tapped. The center tap is connected to a point of reference potential, such as ground 3. The ends of the output winding of the transformer 2 are connected to respective control grids of the amplifier 11, which is preferably a twin-triode vacuum tube having tube sections 12*a* and 12*b* which are connected to operate as a push-pull amplifier. The operation of such amplifiers is well known in the art and no further description is necessary here.

The output signals on the plates of tubes 12*a* and 12*b* are applied to the control grids of the amplifier 30 through the variable attenuator 20. The amplifier 30 is a push-pull driven amplifier formed by respective triode sections 31*a* and 31*b*. The output signal from the plates of the triode sections 31*a* and 31*b* drive the final amplifier 40 which is formed by two pentode tubes 41 and 42, connected in a push-pull circuit. These tubes, except for automatic bias provision, comprise a conventional power amplifier stage. The plates of the respective power amplifier tubes 41 and 42 are connected to the ends of the primary winding of an output transformer 44. The secondary winding of the transformer 44 is connected to an unbalanced T-pad resistance attenuator 45 which provides an output level control. The variable arms of the attenuator 45 are mechanically connected as shown.

Located between the amplifiers 11 and 30 is the attenuator 20 which varies the overall gain of the main amplifier channel 10. The variable attenuator 20 is formed by a bridge type vacuum tube circuit having triode sections 21*a* and 21*b*. The control grids of the two triode sections are connected together so that they receive the same D.C. signal. For a detailed explanation of the particular type of vacuum tube bridge attenuator circuit utilized herein, reference is made to my aforesaid patent No. 2,768,249. It is sufficient to state here, for the purpose of explaining the present invention, that when a positive signal is applied to the grids of vacuum tubes 21*a* and 21*b*, the attenuation supplied by the network 20 increases and the overall gain of the amplifier channel decreases. Conversely, when a negative going signal is applied to the control grids of the tubes, the attenuation decreases and the overall gain of the amplifier circuit increases. In this type of bridge circuit, a linear increase of positive grid voltage produces an exponential reduction of audio output voltage. Therefore, the control capability of the amplifier is greatly extended and flattened.

To produce the signals which control the variable attenuator network 20, the amplified audio input signals at the plates of the vacuum tubes 12*a* and 12*b* are applied to the respective control grids of a twin-triode amplifier 110 formed by tube sections 111*a* and 111*b*. Amplifier 110 is driven in push-pull by the output signals from the amplifiers 12*a* and 12*b*. The connections are conventional for a push-pull amplifier. The amplifier 110 isolates the portion of the control system connected thereto from the main amplifier system thereby substantially reducing harmonic distortion.

The output signals on the anodes of the tubes 111*a* and 111*b* are applied to the cathodes of a dual diode 121 and the anodes of semi-conductor rectifiers 122 thus forming a voltage doubler diode rectifier circuit for producing a negative going signal.

The negative going output signal on the parallel connected anodes of the rectifier 121 is used to charge the slow acting circuit 140. In a preferred embodiment, the charging time of circuit 140 is controlled by a capacitor 131 and a resistor 135, which has a long time constant. A much longer discharge time constant is provided by capacitor 131 and resistor 132. The signal appearing across the integrating circuit 140 is applied to the parallel connected control grids of the variable attenuator 20 through a resistor 133. Due to its negative polarity, the signal at the integrator 140 can only reduce the attenuation of the attenuator network 20 thereby increasing the overall gain of the circuit. The negative signal from the rectifier 121 is clamped to a level which prevents the attenuator 20 from being biased beyond cut off. This is accomplished by a clamping diode 124 which is biased from a voltage divider formed by resistors 126 and 127. The voltage divider is connected to a source of negative potential 8. As signal input further increases, negative output from rectifier 121 is therefore prevented from blanking positive output from rectifier 160. The signals present at the plates of the final power amplifiers 41 and 42 are applied to the input of the isolation amplifier 150, which is formed by triode sections 151*a* and 151*b*. This amplifier is push-pull driven by the two power amplifiers 41 and 42 and is therefore connected in a conventional push-pull circuit configuration. The output signals from the tube sections 151*a* and 151*b* are applied to the inputs of the two rectifiers 160 and 180 which, as shown, are dual diode rectifiers 161 and 181. The diodes 161 and 181 and semi-conductor diodes 164, 184 are connected as voltage doubler circuits and produce a positive voltage at their respective outputs.

The positive voltage at the connected cathodes of the rectifier 161 is applied to the same output as the integrating circuit 140 through a resistor 163. The output signal from the rectifier 161 is, therefore, also applied to the control grids of the variable attenuator 20 in opposition to the signal from the rectifier 121.

The positive going output signal from the rectifier 181 is connected to a fast acting circuit 190, which is an integrating circuit formed by a resistor 191 and a capacitor 192. These components have a short time constant. The output of the short time constant, integrating circuit 190 is applied to the control grids of the variable attenuator 20 through a diode 194 which is polarized to pass only a positive going signal. It should be noted at this point, that the positive signals produced by the rectifiers 161 and 181 serve to increase the current through the respective vacuum tube sections 21*a* and 21*b*, thereby increasing the attenuation and consequently decreasing the overall amplifier system gain.

Considering the operation of the circuit, a bias is supplied to the grids of the vacuum tubes 21*a* and 21*b*, which form the variable attenuator 20, by the variable threshold control 130. The threshold control is connected to the source of negative potential 8. The slider arm on the threshold control 130 is normally positioned so that the variable attenuator 20 provides a fixed attenuation in the absence of an input signal. In a preferred embodiment of the invention, this attenuation is set at about 10 decibels.

As the input signal applied to the transformer 2 increases from a level below the normal level, the negative output signal from the rectifier 121 charges up the time constant circuit 140 negatively and a negative voltage is applied to the control grids of the variable attenuator 20. As previously described, a negative voltage on the grids of the vacuum tubes 21*a* and 21*b* decreases their plate current and consequently reduces the amount of attenuation provided by the network 20, which increases the amplifier gain. In a preferred embodiment of the invention, the increased gain action starts to take place for a signal about 20 decibels below normal signal. The initial 10 decibels of attenuation provided by the attenuator 20 is decreased in a manner as determined by the time constant of the circuit 140.

As the input signal is increased further to a level approaching normal, the rectifier 121 produces a greater negative voltage. This increased negative voltage tries to cut off the vacuum tubes **21*a* and 21*b* thereby eliminating the 10 decibels attenuation previously provided by the attenuator. The negative voltage output of the rectifier 121 is prohibited from rising above the level which would cut off the tubes 21*a* and 21*b* by the clamping diode 124. The voltage divider resistors 126 and 127 are chosen so that any negative going voltage large enough to cut off the tubes 21*a* and 21*b* is effectively limited by the clamp diode 124**.

Rectifier 161 is provided with a threshold voltage by the threshold control 165. The threshold 165 is formed by resistors 166 and 167 which are connected to the negative voltage power supply 8 through resistors 186 and 187 of the threshold control 185. The negative voltage from the voltage divider 166—167 is used to back-bias semi-conductor diodes 164, so that only positive going signals greater than the back-bias voltage are allowed to pass to the anodes of rectifier 161. This bias is chosen so that rectifier 161 will not develop a positive output voltage until a signal on its anodes is of a level representative of an approximately normal volume input signal level. Similarly, semi-conductor diodes 184, which are connected to the anodes of rectifier 181, receive a higher back-bias so that only positive peaks reach the anodes of rectifier 181.

Input signals at or greater than the normal level overcome the threshold voltage supplied by the resistors 166 and 167 and the rectifier 161 develops a positive output voltage. This positive output voltage is supplied through resistor 163 to the same output point as the time constant circuit 140. The resistance of resistor 163 is made smaller than the resistance of resistor 135, which is the output load for the negative voltage doubler 121. Therefore, the positive D.C. signal from the rectifier 161 takes precedence over the negative D.C. signal from the rectifier 121 and is supplied to the grids of the attenuator 20. Since the signal from the rectifier 161 is of positive polarity, the plate current of the vacuum tubes **21*a* and 21*b*** is increased, thereby inserting attenuation into the main amplifier channel which is equal to the increased signal input to the amplifier channel.

The outputs of rectifiers 121 and 161 are connected to relatively long-time constant circuits. The long-time constant circuit for the rectifier 121 is formed by the charging resistor 135 and the capacitor 131 and the discharging resistor 132. The time constant circuit for the rectifier 161 is formed by the charging resistor 163 and capacitor 131, with the discharge also taking place through resistor 132. The time constant for the rectifier 121 is preferably chosen to have an attack time of approximately 7 seconds and a release time of approximately 30 seconds. The time constant for the rectifier 161 is preferably chosen to have an attack time of approximately 20 milliseconds and a release time of approximately 30 seconds.

Since the time constants for these two rectifiers are relatively long, the control voltage applied to the grids of the variable attenuator 20 changes relatively slowly for changes in input signal. The charge and discharge time constants are also chosen so that a 10 decibel increase or decrease of the attenuation of the attenuator 20 requires nearly one minute to return to normal during the absence of a signal. Stated another way, if the attenuator 20 is originally set to provide 10 decibels attenuation, if this attenuation is decreased to 0 decibels by an input signal of smaller magnitude than the normal level or increased to 20 decibels by an input signal of greater than normal level, it would take approximately one minute for the attenuator to return to its original condition of supplying 10 decibels of attenuation, in the absence of an incoming signal. However, under normal signal conditions, whether the input signals are above or below normal, the control signals provided by the rectifiers 121 and 161 continuously correct the attenuator 20 in the direction to provide a normal level amplifier output from the main amplifier channel.

Since the threshold 165 derives its voltage from the center arm of the threshold 185, there is a constant differential bias between rectifiers 161 and 181, with rectifier 181 having the greater bias. This means that the rectifier 181 will conduct and produce a positive output voltage only when the positive input signal is at a predetermined level above the normal input level. In a preferred embodiment of the invention, this constant differential is adjusted, by suitable choice of the resistors 166, 167, 186 and 187 so that rectifier 181 rectifies only peak signals which are approximately 4 decibels higher than the normal amplifier output level maintained by rectifier 161.

The output of rectifier 181 charges an integrating circuit 190 formed by a small value condenser 192 and a charging resistor 191. The integrating circuit discharges through a resistor 193. Since the integrating circuit formed by components 191, 192 and 193 has a relatively short time constant with respect to the input signal, the output voltage from this circuit rapidly follows the input voltage supplied to the rectifier 181.

The output of the short time constant circuit 190 is applied to the control grids of the tubes **21*a* and 21*b* through a diode 194 which serves to isolate the action of the rectifier 181 from the rectifiers 121 and 161. The diode 194 is normally maintained in a non-conductive condition by a biasing voltage obtained through resistor 193 across a voltage divider network formed by resistors 196 and 197. One end of resistor 197 is connected to the source of negative potential 8. The bias for diode 194 is normally chosen so that it is overcome only by the extreme peaks of the input signals which are rectified by the diode 181. The rapidly occurring positive voltage of the time constant circuit 190 is applied to attenuator 20** which increases its attenuation almost instantaneously in accordance with the occurrence of a peak input signal. In this manner, the main channel amplifier output does not rise appreciably above the output level maintained for normal input.

The rapidly occurring positive output voltage from the rectifier 181, in addition to being supplied to the attenuator 20, is also supplied through a capacitor 34 and resistors 35 and 36 to the respective grids of the tubes **31*a* and 31*b* of the amplifier 30. This rapidly occurring positive voltage, developed by the peaks in the input signal, is equal in magnitude and opposite in polarity to the negative going voltage caused by a drop in plate voltage on the plates of the amplifiers 12*a* and 12*b*, across resistors 13*a* and 13*b* when the system receives a rapidly increasing signal at its input. This neutralizing action is an effective means of "thump" suppression and eliminates the necessity for an expensive inter-stage transformer which would normally be used at the input to the tubes 31*a* and 31*b***. This transformer also added a great deal of bulk to previous systems.

The embodiment of the invention shown in FIGURE 2 is designed for use in a high fidelity broadcasting system. Therefore, it is necessary to provide a wide bandwidth of substantially flat frequency response over the range of approximately 10 cycles per second to 30,000 cycles per second. This is accomplished in the present system in a number of ways. First of all, tubes **12*a* and 12*b* are provided with neutralizing capacitors 15*a* and 15*b*. Capacitor 15*a* is connected between the control grid of tube 12*a* and the plate of tube 12*b*, while capacitor 15*b* is connected between the plate of tube 12*a* and the grid of tube 12*b*. In this manner, neutralizing feedback is supplied which serves to increase the frequency response of the tubes 12*a* and 12*b*** by decreasing high frequency degeneration within the tube. This action is well known and no further description is needed.

Tubes 111a and 111b are similarly provided with the respective neutralizing capacitors 113a and 113b. Neutralizing capacitors 153a and 153b are also provided for tube sections 151a and 151b.

In order to achieve low harmonic distortion, which is desirably held to 0.5% or less, rectifier 121 is isolated from the main channel amplifier by the isolating amplifier 110. Similarly, rectifiers 161 and 181 are isolated from the main channel amplifier by isolating amplifier 150. These amplifiers 110 and 150 isolate their respectively connected rectifiers from the main channel amplifier 10, thereby reducing circuit interaction and preventing harmonics, which are generated due to the non-linear loading of the rectifiers 121, 161 and 181.

In order to improve the low frequency response of the main channel amplifier and to maintain the low frequency distoration at the 0.5% level, a D.C. balance is provided in the primary of output transformer 44. This is accomplished by a bias compensation circuit associated with the power output tubes 41 and 42. The bias compensation circuit serves to substantially equalize the anode current of the tubes 41 and 42. The bias compensating circuit consists of the resistors 46 and 47, which are respectively connected to the control grids of the tubes 41 and 42. The resistor 46 is returned to the cathode of tube 42 and the resistor 47 is returned to the cathode of tube 41. Thus, if tube 41 tends to draw more anode current, the higher cathode potential of tube 41 biases the control grid of tube 42 through resistor 47 causing tube 42 to draw more anode current. On the other hand, the relatively low cathode potential of tube 42 biases the control grid of tube 41 through resistor 46 less positively, which lowers its anode current. In this manner, the anode currents of tubes 41 and 42 are substantially equalized. It should also be noted that the control grids of the tubes 41 and 42 are maintained at a negative voltage with respect to the cathode by resistors 48 and 49 which are connected to the negative power supply 8. This arrangement provides nearly perfect balancing of the anode currents of even unmatched tubes, thus greatly reducing the D.C. saturation of the output transformer 44.

In order to make this compensating action as effective as possible, the cathode resistors for the tubes 41 and 42 are made approximately six times the normal cathode resistance for the particular tube type used. A further increase in cathode resistance above the six times value only produces slightly additional balancing and sacrifices considerable anode supply voltage, since the tube must be operated at a higher anode potential.

The large amount of cathode degeneration which would normally occur, due to the high value cathode resistors for the tubes 41 and 42, is eliminated by use of capacitors 51 and 52 which are connected in series between the cathodes of the tubes 41 and 42. These capacitors may be a single non-polarized condenser. The bias compensating circuit described above results in distortion reduction at frequencies as low as 20 cycles per second in the order of 10:1 for a pair of tubes which would normally be passed by a standard tube checker. Distortion values in the order of 0.25% are obtained.

Figure 3:
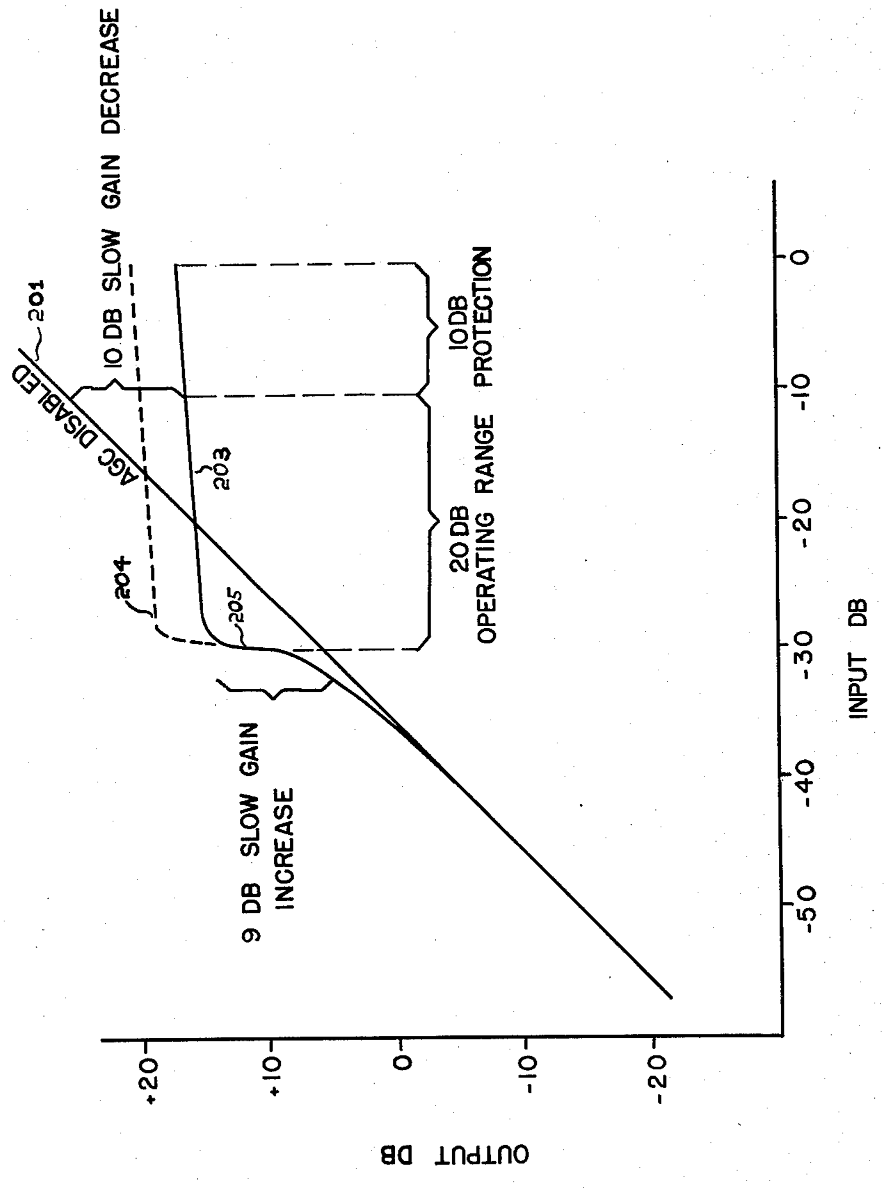
FIGURES 3–6 are curves depicting the operation of the amplifier system.

FIGURE 3 shows characteristic curves for the operation of a preferred embodiment of the amplifier system. The input signal level is plotted along the abscissa of the graph while the output signal level is plotted on the ordinate. Line 201 denotes the system working as a linear amplifier with the automatic control channel disabled. As can be seen, from the constant slope of the line 201, the system operates linearly and provides no volume compression.

Lines 203 and 204 show system operation with the control circuit working. As previously described, a gain reduction of approximately 10 db is placed in the circuit under no-signal conditions. As the signal is increased from a very low value, the negative D.C. signal from rectifier 120 applied through the slow acting circuit 140 starts to cut off the attenuator tubes, approaching complete cut-off at approximately 10 db below normal input. This produces approximately a 10 db, slow increase in the overall gain of the system, which is denoted by the bracketed portion 205.

Just previous to attenuator cut-off, as the input signal increases further, rectifier 160 becomes operative and the positive D.C. signal which it produces is applied to the attenuator through the slow acting circuit 170. This signal takes precedence over the signal from rectifier 120 and slowly reduces the gain of the system for increasing input signals. This is shown by the gently sloping portion of line 203. The fast gain decrease action provided by the rectifier 180 is denoted by the dotted line 204. As can be seen, line 204 is substantially parallel to the slow gain decrease line 203, but is set at level about 4 db higher. Rectifier 180 feeds the fast acting circuit 190 and its positive D.C. signal takes precedence over the other two signals to produce a fast gain decrease. The fast gain decrease circuit only functions until overtaken by the slow gain decrease circuit.

In order to monitor the amount of gain increase or decrease in the main channel amplifier 10, a current meter 53 is provided. This meter is connected from the cathodes of tubes 21a and 21b of the attenuator 20 to the point of reference potential 3. Since the current increase or decrease in the tubes 21a and 21b is not equal for equal amounts of decibel increase or decrease in amplifier gain, and, since it is desirable to make the meter 53 a zero center reading with equal decibel scales on each side of the center and with decibel decrease on the right side and decibel increase on the left side, the meter must be compensated. This compensation results in decibel scales of uniformly spaced increments. The compensation circuit is formed by shunting the meter 53 with the semi-conductor diode 54. A current divider, formed by resistors 55 and 56, is used to zero center the meter. The values of the resistances 55 and 56 are chosen to zero center the meter for either a normal input signal or for no input signal. Such metering techniques are well known in the art and no further description is believed necessary here. A V.U. meter 58 is connected to the cathodes of tubes 111a and 111b, to measure input signal level. Also, a V.U. meter 59 is connected across the secondary winding of the output transformer 44 to measure the amplifier system output level.

A switch 57 is provided to disable the control circuit from the main channel amplifier. Disabling the control channel 100 might be desirable for the purpose of running proof of performance tests on complete transmitting systems, calibrating the meter 53, etc. When the switch 57 is in the closed position, the automatic amplifier main channel 10 is made a standard constant gain amplifier, since a constant bias is supplied to the grids of the tubes 21a and 21b from the threshold control 130 through the switch 57. At the same time, when switch 57 is closed, the inputs to the rectifier 161 having the slow time constant circuit and the rectifier 181 having the fast time constant circuit are shorted. Resistors 132 and 133 which are connected to the integrating capacitor 131 for rectifier 121, are also shorted. These rectifiers then become ineffective to control the gain of the amplifier.

The bias applied to the tubes 21a and 21b when the switch 57 is closed is the same potential used during automatic operation when the attenuator 20 is set to provide approximately 10 decibels of attenuation for zero input signal. At this point, the meter 53 reads center zero, the center positioning being established by adjusting the threshold control 130. Therefore, by closing switch 57 the meter 53 also returns to zero center and remains at zero center during any level of program or signal. This provides a convenient check on the proper setting of adjustable resistor 130, this adjustment being the main calibration for the automatic operation.

Figure 4:
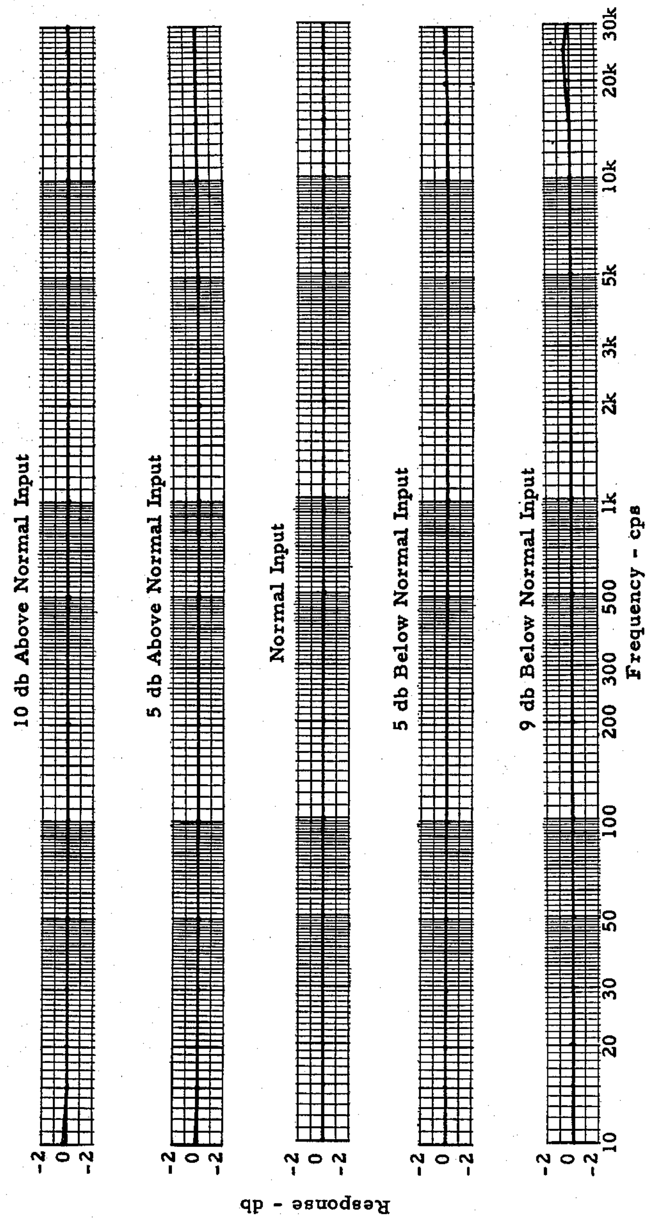

The frequency response of the amplifier system, under various signal level conditions, is essentially flat from 10 cycles per second to 30,000 cycles per second. This is shown in the curves of FIGURE 4, which plot the frequency response of the system for various levels of input signal from 10 db above normal to 9 db below normal. The flatness of the response curve over the wide frequency range is due in large part, to neutralizing all high resistance grid circuits and correcting for input and output transformer characteristics.

Figure 5:
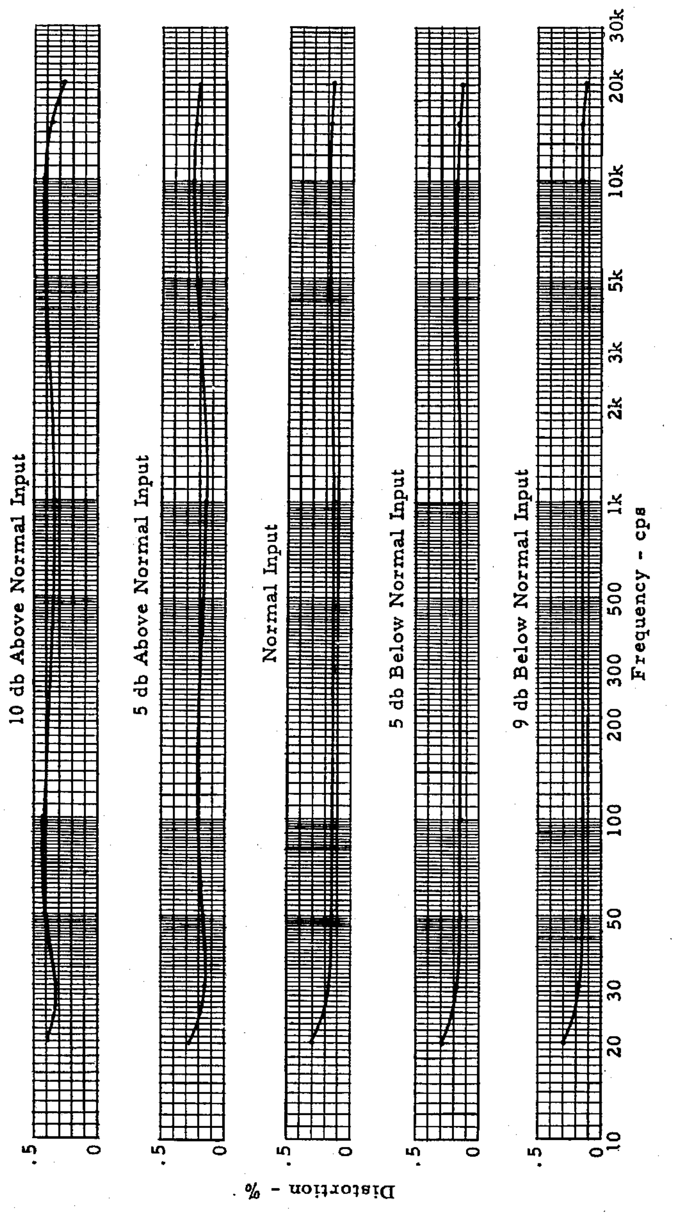

Referring to FIGURE 5, it can be seen that the distortion of the system is kept to within less than 0.5% for input signals in the range from 9 db below to 10 db above normal input signal levels. The low distortion is obtained in most part by providing the isolation amplifiers 110 and 150, so as to isolate any distortion which might be introduced by the rectifiers 120, 160 and 180. Additionally, it should be noted that the grid bias resistors 46 and 47 of the amplifiers 41 and 42 are returned to opposite cathodes and the control grids of these amplifiers are supplied with negative bias, which is fed directly through high value resistors 48 and 49 from the negative potential source 8. Additionally, the cathode resistors for the amplifiers 41 and 42 are of a relatively high value to provide a degenerative effect.

Figure 6:
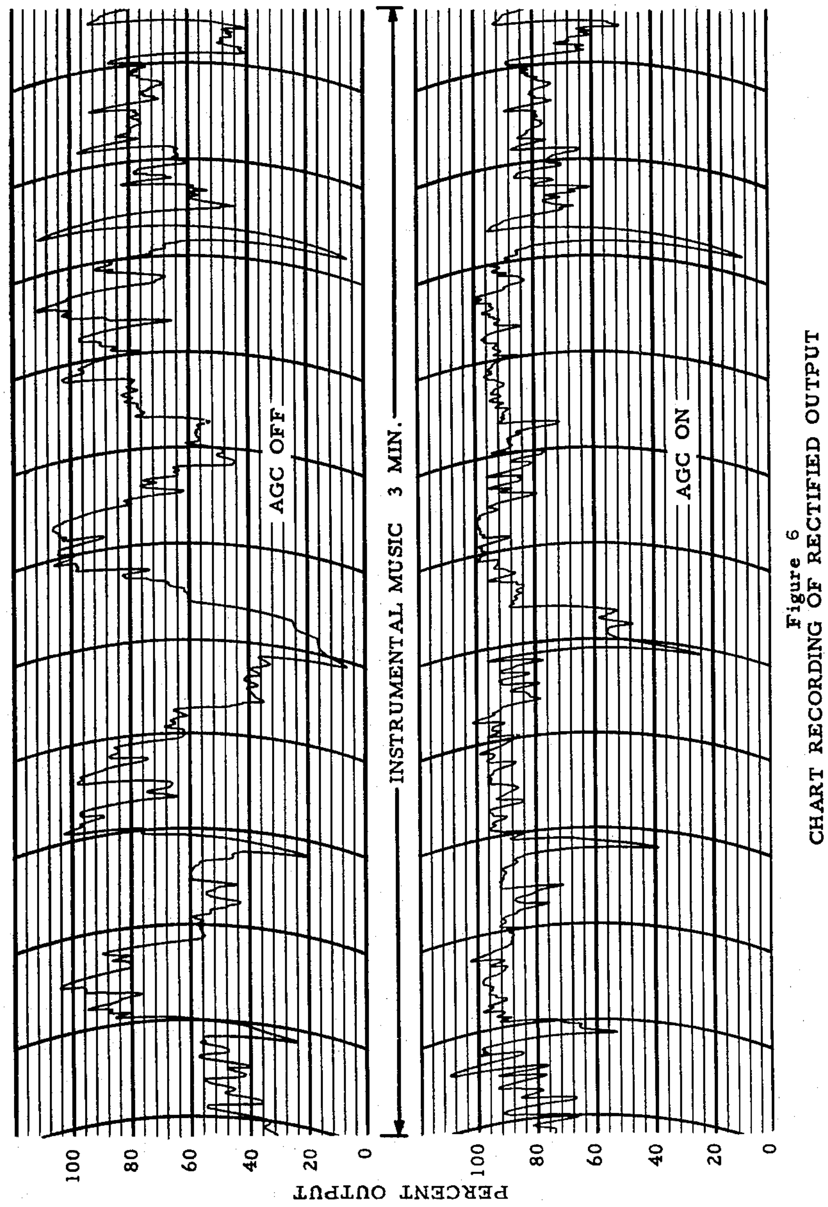

Referring now to FIGURE 6, a chart recording of the amplifier output signal for 3 minutes of instrumental music input signal is shown for two conditions of amplifier output. The top drawing shows the amplifier output signal with the automatic gain control circuit "off" while the bottom drawing shows the output of the amplifier with the automatic gain control circuit "on." In both cases, the amplifier output signal is rectified before recording. It should be noted that with the automatic gain control circuit "on," most of the signal is compressed into the volume level between 80–100% output. The marked effect on the compression of the input signal is readily seen by comparing the action of the circuit with the automatic gain control circuit "off," wherein the signal varies almost completely over the range from zero to 100% output.

While I have described a preferred embodiment of the invention, it will be understood that I wish to be limited not by the foregoing description, but solely by the claims granted to me.

What is claimed is:

1. In a signal translating circuit, the combination of:

a variable bridge-type attenuator having an input circuit and an output circuit and a control circuit;

means coupled to said input circuit for supplying input signals to said attenuator;

amplifying means coupled to the output circuit of the attenuator, said amplifying means having an input circuit and an output circuit and said attenuator and amplifying means being arranged in series in a signal channel;

means comprising a first isolation amplifier and a rectifier and a first long time-constant rectifier load arranged in forward cascade between said attenuator input circuit and said control circuit for developing a first control signal in response to input signals below a predetermined level and applying said control signal to the attenuator, thereby slowly to decrease the attenuation;

and means comprising a second isolation amplifier and a second rectifier and a second long time-constant rectifier load arranged in reverse cascade between the output circuit of said amplifying means and said control circuit for developing a second control signal in response to input signals above a predetermined level and applying them to the attenuator slowly to increase the attenuation.

2. In a signal translating circuit, the combination in accordance with claim 1, and a third rectifier and a short time-constant rectifier load arranged in reverse cascade between the output circuit of said second isolation amplifier and said control circuit for suddenly increasing attenuation in response to undesired input signal peaks.

3. The combination in accordance with claim 2 in which the amplifying means comprises a first stage including a push-pull-arranged pair of triodes each having at least anode and cathode and grid electrodes, and means for coupling the short time-constant rectifier load to both of said grids to neutralize the effect of large-amplitude, rapidly changing input signals.

4. In a signal translating circuit, the combination in accordance with claim 3 in which the amplifying means includes a second stage coupled to the first stage and comprising a pair of vacuum tubes each of which has at least cathode, control, and anode electrodes arranged in a push-pull configuration, and means for balancing the anode currents of the last-mentioned tubes comprising a resistor connected from the control electrode of one to the cathode of the other, and another resistor connected from the control electrode of the other to the cathode of said one, and high-value cathode resistors between each of said cathodes and a point of reference potential.

References Cited in the file of this patent

UNITED STATES PATENTS

| | | |
|---|---|---|
| 2,157,326 | Doba | May 9, 1939 |
| 2,295,410 | Kreuzer | Sept. 8, 1942 |
| 2,544,340 | Maxwell | Mar. 6, 1951 |
| 2,673,890 | Montgomery | Mar. 30, 1954 |
| 2,935,697 | McManis | May 3, 1960 |